US009304173B2

(12) United States Patent
Fink

(10) Patent No.: US 9,304,173 B2
(45) Date of Patent: Apr. 5, 2016

(54) DETERMINING THE INTERNAL RESISTANCE OF A BATTERY CELL OF A TRACTION BATTERY THAT IS CONNECTED TO A CONTROLLABLE MOTOR/GENERATOR

(75) Inventor: Holger Fink, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 826 days.

(21) Appl. No.: 13/514,910

(22) PCT Filed: Oct. 25, 2010

(86) PCT No.: PCT/EP2010/066054
§ 371 (c)(1),
(2), (4) Date: Aug. 14, 2012

(87) PCT Pub. No.: WO2011/069741
PCT Pub. Date: Jun. 16, 2011

(65) Prior Publication Data
US 2012/0310567 A1 Dec. 6, 2012

(30) Foreign Application Priority Data

Dec. 11, 2009 (DE) .......................... 10 2009 054 546

(51) Int. Cl.
G01R 31/36 (2006.01)
B60L 11/18 (2006.01)
B60L 15/20 (2006.01)
G01R 31/00 (2006.01)

(52) U.S. Cl.
CPC ......... *G01R 31/3662* (2013.01); *B60L 11/1803* (2013.01); *B60L 11/1857* (2013.01); *B60L 15/20* (2013.01); *B60L 2240/421* (2013.01); *B60L 2240/423* (2013.01); *B60L 2240/545* (2013.01); *B60L 2240/547* (2013.01); *B60L 2240/549* (2013.01); *B60L 2260/50* (2013.01); *G01R 31/007* (2013.01); *G01R 31/3631* (2013.01); *Y02T 10/642* (2013.01); *Y02T 10/7005* (2013.01); *Y02T 10/705* (2013.01); *Y02T 10/7275* (2013.01)

(58) Field of Classification Search
CPC .................. G01R 31/3662; B60L 11/1857
USPC ............................. 702/63; 429/61; 324/430
See application file for complete search history.

(56) References Cited

U.S. PATENT DOCUMENTS 5,744,962 A 4/1998 Alber et al.
2004/0076872 A1* 4/2004 Kinoshita et al. ............... 429/61

FOREIGN PATENT DOCUMENTS

| CN | 1132355 | 10/1996 |
| CN | 101339230 | 1/2009 |
| JP | 2002-252901 | 9/2002 |
| JP | 2003-319503 | 11/2003 |
| JP | 2004-138586 | 5/2004 |
| JP | 2007-85772 | 4/2007 |
| JP | 2007-524332 | 8/2007 |

OTHER PUBLICATIONS

Liangfei Xu et al., "Modeling and Simulation of a Hubrid Fuel Cell System and Energy Management Strategy", Journal of Mechanical Engineering, Jan. 2009, vol. 45, No. 1, pp. 141-153.
International Search Report for PCT/EP2010/066054, dated Dec. 27, 2010.
El-Hassane Aglzim et al.: "Impedance Measurement of a Fuel Cell on Load," Electrical Power Quality and Utilisation, 2007. EPQU 2007. $9^{TH}$ International Conference on, IEEE, Piscataway, NJ, USA, Oct. 9, 2007, pp. 1-4.
* cited by examiner

*Primary Examiner* — Toan Le
*Assistant Examiner* — Manuel Rivera Vargas
(74) *Attorney, Agent, or Firm* — Kenyon & Kenyon LLP

(57) ABSTRACT

In a method and a device for determining the internal resistance of a battery cell of a battery, the battery is connected to a controllable motor/generator in such a way that a flow of energy can take place from the battery to the motor/generator or from the motor/generator to the battery, including the following steps: modulation of the magnetic field-forming portion of the motor/generator, determination of a change in voltage at the battery cell and of a change of the current flow through the battery cell during the modulation of the magnetic field-forming portion of the motor/generator, and calculation of the internal resistance of the battery cell as the quotient of the change in voltage and the change in current flow.

7 Claims, 3 Drawing Sheets

DETERMINING THE INTERNAL RESISTANCE OF A BATTERY CELL OF A TRACTION BATTERY THAT IS CONNECTED TO A CONTROLLABLE MOTOR/GENERATOR

BACKGROUND OF THE INVENTION

1. Field of the Invention

The present invention relates to a method and to a device for determining the internal resistance of a battery cell of a battery, in particular a traction battery.

2. Description of the Related Art

It is becoming apparent that in the future new battery systems will increasingly be used both in stationary applications, e.g. wind power installations, and also in vehicles, e.g. in hybrid and electric vehicles. In the present application, the terms "battery" and "battery system" will be used for "accumulator" or "accumulator system," in accordance with everyday usage.

The functional design of a battery system known from the prior art is shown in FIG. 2. In order to achieve the required power and energy data with the battery system, in a battery cell 1 individual battery cells 1a are connected in series, and partly also in parallel.

Between battery cells 1a and the poles of the battery system there is situated a so-called safety and fuse unit 16 that is used for example to connect and disconnect battery 1 to external systems and to protect the battery system against impermissibly high currents and voltages, as well as providing safety functions such as the single-pole separation of battery cells 1a from the battery system poles when the battery housing is opened. A further functional unit is formed by battery management system 17, which, alongside battery state recognition system 17a, also carries out the communication with other systems, as well as the thermal management of battery 1.

Battery state recognition functional unit 17a shown in FIG. 2 has the task of determining the current state of battery 1 and of forecasting the future behavior of battery 1, e.g. providing a battery life forecast and/or a range forecast. The forecasting of future behavior is also referred to as prediction. The design of a model-based battery state recognition system is shown in FIG. 3. The depicted model-based battery state recognition and prediction system is based on an evaluation of the electrical quantities battery current and battery voltage, as well as the temperature of battery 1, using an observer 17b and a battery model 17c in a known manner. The battery state recognition can be carried out for individual cells 1a of a battery 1, this recognition then taking place on the basis of the corresponding cell voltage, the cell current, and the cell temperature. In addition, the battery state recognition can also be carried out for the overall battery 1. Depending on the desired degree of precision, this then takes place either through evaluation of the states of the individual cells 1a of battery 1 and an aggregation based thereon for the overall battery 1, or directly by evaluating the overall battery voltage, the battery current, and the battery temperature. In all the methods known from the prior art, the current courses, voltage courses, and temperature courses that occur during normal operation of battery 1 are used to determine the battery state and to predict the future behavior.

BRIEF SUMMARY OF THE INVENTION

An object of the present invention is to present a new design for determining the internal resistance of the individual cells of a battery system, with which, compared to the current prior art, the battery state recognition and prediction can be realized more robustly, more precisely, and independent of the operating state of the battery.

In contrast to the prior art, the method and the device according to the present invention have the advantage that they can be used to determine the internal resistance of battery cells in battery systems operated in an integrated system having an electrical drive, without additional electronic circuit outlay, or with only a small additional electronic circuit outlay. Compared to current prior art, this method and this device have the advantage that the same operating procedure can always be used to determine the internal resistance, thus enabling a particularly robust and precise determination. This is not possible with the currently known methods.

Particularly preferably, the method according to the present invention has the feature that the modulation of the portion of the motor/generator that forms the magnetic field takes place when the motor/generator is in a no-load state.

In addition or alternatively, the method according to the present invention has the feature that for the modulation of the portion of the motor/generator forming the magnetic field, the magnetization of the motor/generator is increased and/or reduced.

Alternatively or in addition, the method according to the present invention includes the step of determining an increase as a function of aging of the internal resistance of the battery cell on the basis of a known functional dependence of the internal resistance on a cell temperature existing during the determination of the internal resistance and on a charge state of the battery cell existing during the determination of the internal resistance. The corresponding preferred development of the device according to the present invention preferably has for this purpose a table that stores a functional dependence of the internal resistance on a cell temperature existing during the determination of the internal resistance and on a charge state of the battery cell existing during the determination of the internal resistance, and an evaluation unit that determines an increase as a function of aging of the internal resistance of the battery cell on the basis of the determined internal resistance and a querying of the table. As an alternative to the table, a second computing unit can be provided that reproduces, on the basis of one or more mathematical equations, the functional dependence of the internal resistance on the cell temperature existing during the determination of the internal resistance and on the charge state of the battery cell existing during the determination of the internal resistance.

In addition, the method according to the present invention and the device according to the present invention preferably have, in addition or alternatively, the feature that the motor/generator is an induction machine operated via a pulse-controlled inverter.

DETAILED DESCRIPTION OF THE INVENTION

In the following, a preferred specific embodiment of the present invention is described in detail with reference to the Figures.

Figure 1:
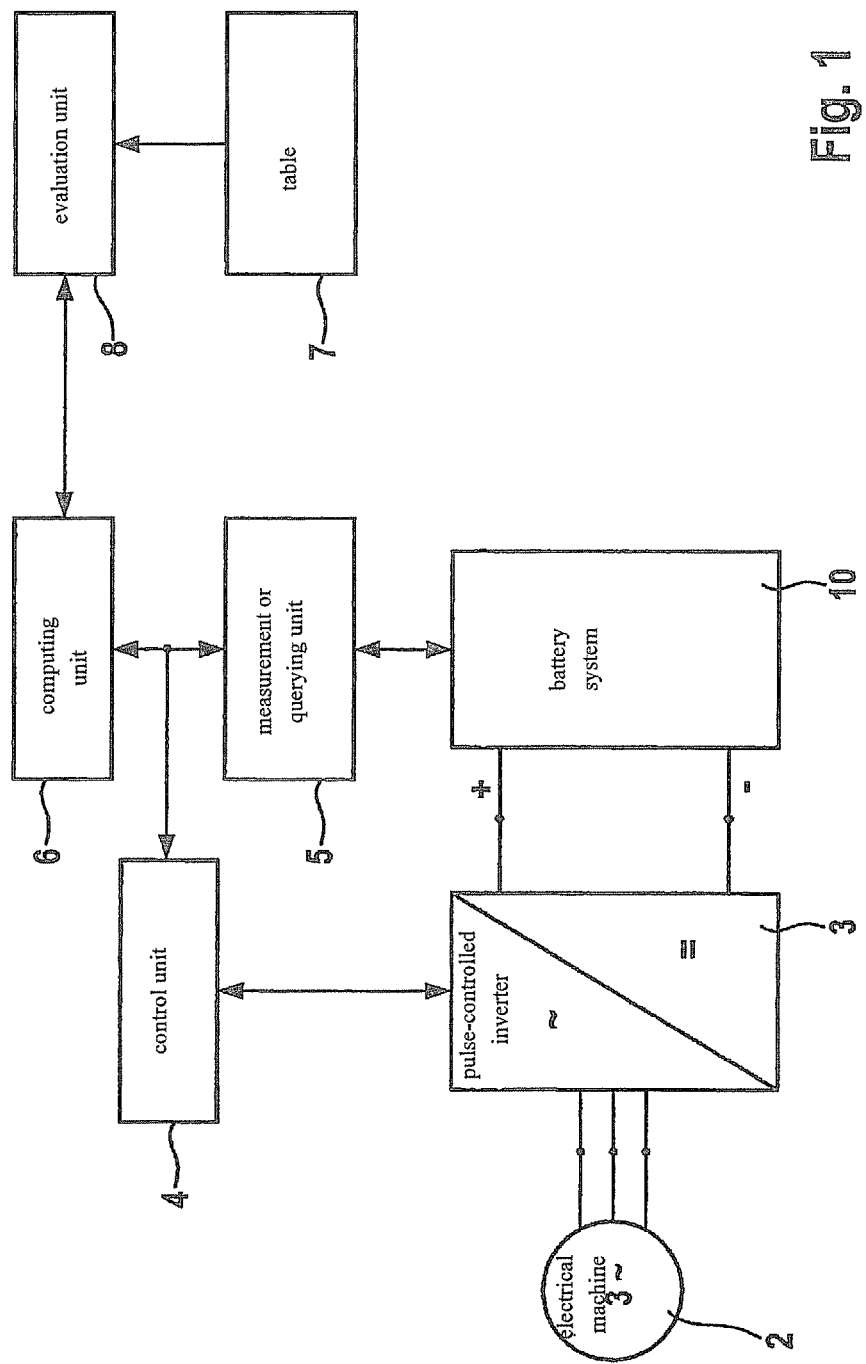
FIG. 1 shows a schematic diagram of a first preferred specific embodiment of a device according to the present invention for determining the internal resistance of a battery cell
Figure 2:
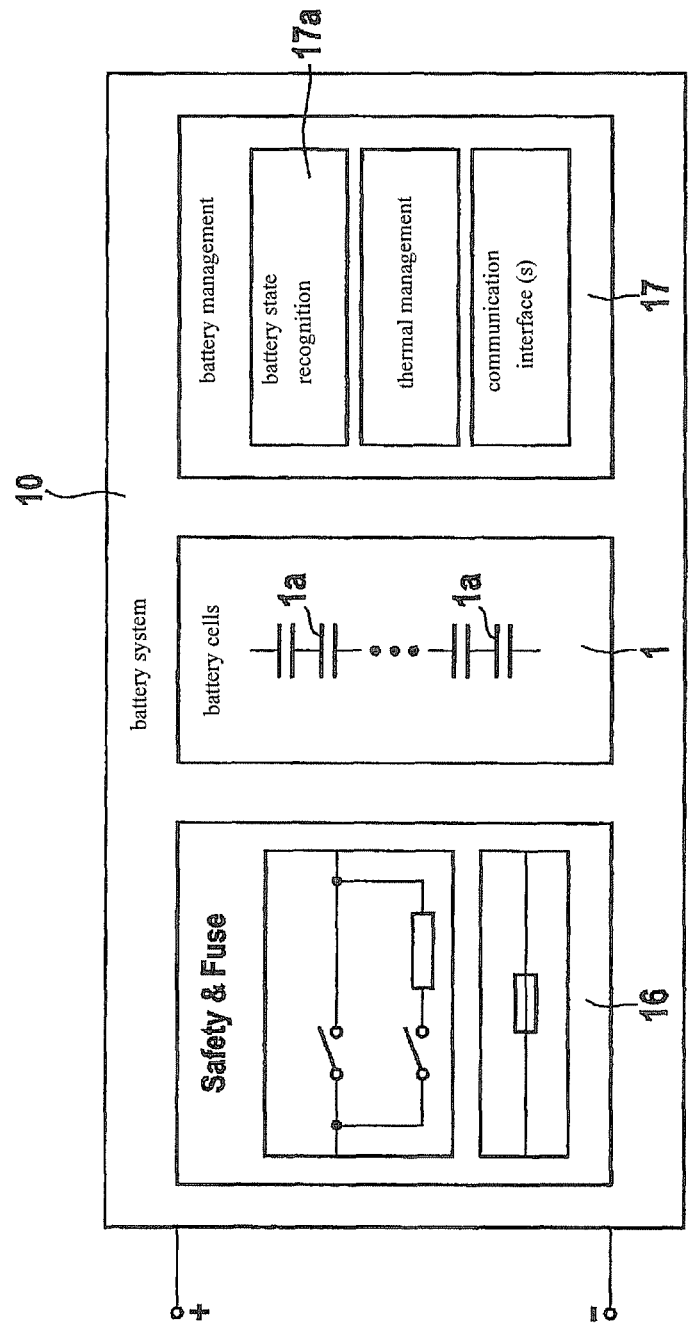
FIG. 2 shows a functional design of a battery system known from the prior art.
Figure 3:
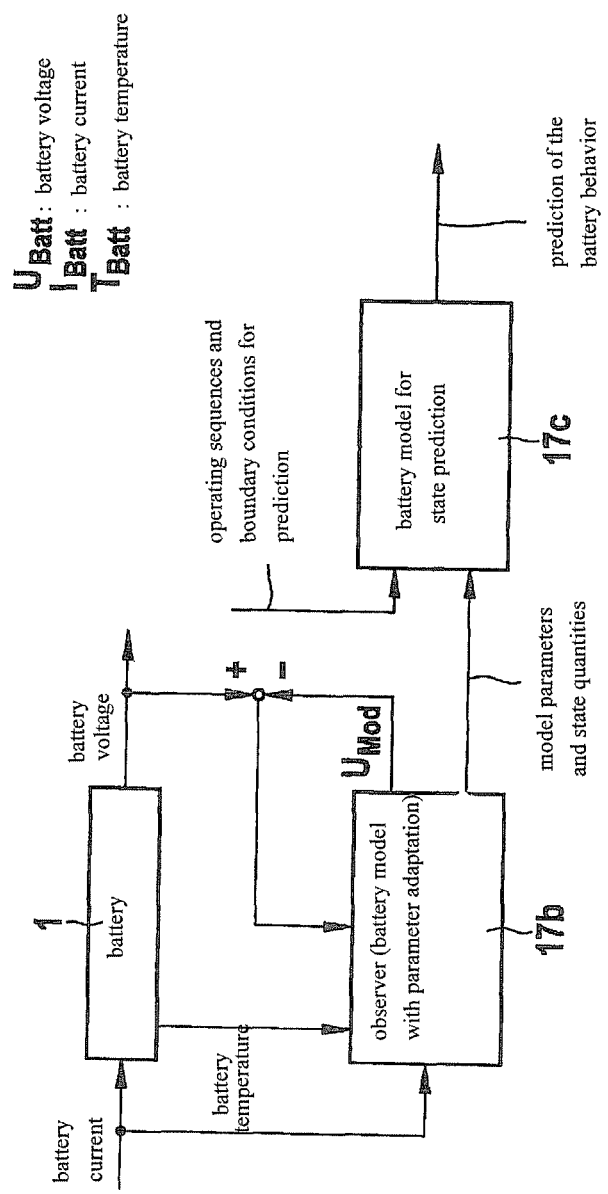
FIG. 3 shows a schematic diagram of a model-based battery state recognition and prediction system known from the prior art.

FIG. 1 shows a preferred specific embodiment of the device according to the present invention.

This device has an electrical drive 2 fed by a battery system 10. Electrical machine 2 is an induction machine (e.g. an asynchronous or synchronous machine). Machine 2 is connected to battery system 10 via a pulse-controlled inverter 3. Using pulse-controlled inverter 3, it is possible both to produce a flow of power from battery 1 of battery system 10 to electrical machine 2 (pulse-controlled inverter 3 then operates as an inverter, and electrical machine 2 is operated as a motor) and to produce a flow of power in the opposite direction, from electrical machine 2 to battery 1 (pulse-controlled inverter 3 then operates as a rectifier, and electrical machine 2 is operated as a generator).

In industrial applications, for the operation of induction machines with the use of pulse-controlled inverters, today the use of a so-called field-oriented machine controlling is prior art. The regulation of the machine currents takes place here in a coordinate system that co-rotates with the magnetic field of the machine. In this way it is possible to divide the machine currents into a so-called (magnetic) field-forming portion and a torque-forming portion. In an operating state in which the machine does not output a torque to its shaft (no-load operation at any rotational speed), the field-forming portion of the machine current can be altered without thereby building up torque on the shaft. The method according to the present invention described below for determining the internal resistance of the battery cells is based on modulation of the field-forming portion of the induction machine.

As starting point for the explanation of the method according to the present invention, assume an operating state in which electrical machine 2 does not output a torque to its shaft, and battery system 10 is connected to the traction vehicle electrical system via the power switch of safety and fuse unit 16. The determination of the internal resistance of the battery cells is then realized as follows according to the present invention: after a command to activate an operating mode "determine the internal resistance" is given to control unit 4, this unit thereupon modulates the field-forming portion of the machine current in such a way that machine 2 no longer outputs torque to the shaft, but the magnetization changes. In order to increase the magnetization, a flow of power from battery 1 to electrical machine 2 is required. Conversely, in the case of a reduction of the magnetization a flow of power takes place from electrical machine 2 to battery 1. Through superposition of an alternating portion on the magnetization desired in normal operation of electrical machine 2, it is possible to impress an alternating current (charging and discharging of the battery) onto battery 1. An alternating current causes a voltage drop in the ohmic internal resistance in battery cells 1a. In the case of lithium-ion batteries used in hybrid or electric vehicles, an acquisition of the voltages of all battery cells is carried out in order to enable execution of a balancing of the charge state and a monitoring of the maintenance of the permissible voltage boundary values. In order to carry out the battery state recognition, the battery current is acquired. In this way, in the battery system the required information is available that is acquired by a measurement or querying unit 5 connected to control unit 4 in order to determine the internal resistances, given the above-described excitation of the battery cells, using a computing unit 6 connected to control unit 4 and to measurement and querying unit 5; this determination takes place for example in accordance with the equation:

$$R_{i\_n}(Temp, \text{aging}) = \frac{\Delta U_n}{\Delta I} \quad (1)$$

(where n is the indexed variable for the cells of the battery system).

Instead of acquiring the voltages of all battery cells and of the battery current via battery management system 17, measurement or querying unit 5 can also acquire these quantities directly.

Given a known functional dependence of the internal resistance on the cell temperature and on the charge state of the cell, the increase as a function of aging of the internal resistance of the battery cell can be determined. For this purpose, computing unit 6 is connected to an evaluation unit 8 that determines the increase as a function of aging of the internal resistance of battery cell 1a (n) on the basis of the determined internal resistance and a querying of a table 7 that stores the functional dependence of the internal resistance on the cell temperature existing during the determination of the internal resistance and on a charge state of battery cell 1a existing during the determination of the internal resistance. As an alternative to querying table 7, a second computing unit can be queried that reproduces the functional dependence of the internal resistance on the cell temperature and the charge state on the basis of mathematical equations. The method according to the present invention presented here for determining the internal resistance can for example be carried out even when the vehicle is shut off. In this way, the determination of the internal resistance is not negatively influenced by the superposed "normal operation" of battery 1. This is a significant advantage over methods known up to now.

Using the presented method for determining the internal resistance of the battery, one of the essential items of information required for battery state recognition and prediction—the change of the internal resistance of the battery cells as a function of temperature, charge state, and aging—can be determined even in operating states in which the battery current does not significantly change in "normal operation." In the methods known up to now, the internal resistance can be determined only in operating phases in which the battery current changes significantly during "normal operation." In this way, it is possible to carry out the determination of the internal resistance of the battery cells in a manner that is significantly more robust and more precise in comparison with the prior art.

In addition to the above written disclosure, reference is here made expressly to the disclosure in the Figures.

What is claimed is:

1. A method for determining the internal resistance of a battery cell of a battery, comprising:
    connecting the battery to a controllable motor/generator in such a way that a flow of energy takes place (i) from the battery to the motor/generator and (ii) from the motor/generator to the battery;
    modulating a magnetic field-forming portion of the motor/generator by alternating the direction of flow of energy between the battery and the motor/generator, wherein the modulation of the magnetic field-forming portion of the motor/generator takes place when the motor/generator is in a no-load state;

determining a change in voltage at the battery cell and a change in the current flow through the battery cell during the modulation of the magnetic field-forming portion of the motor/generator; and calculating the internal resistance of the battery cell as a quotient of the determined change in voltage and the determined change in the current flow.

2. The method as recited in claim 1, wherein for the modulation of the magnetic field-forming portion of the motor/generator, magnetization of the motor/generator is increased and reduced.

3. The method as recited in claim 1, further comprising:
determining an aging-related increase of the internal resistance of the battery cell on the basis of a known functional dependence of the internal resistance on (i) a cell temperature existing during the determination of the internal resistance and (ii) a charge state of the battery cell existing during the determination of the internal resistance.

4. The method as recited in claim 1, wherein the motor/generator is an induction machine operated via a pulse-controlled inverter.

5. A device for determining the internal resistance of a battery cell of a battery connected to a controllable motor/generator in such a way that a flow of energy takes place (i) from the battery to the motor/generator and (ii) from the motor/generator to the battery, the device comprising:

a control unit for modulating a magnetic field-forming portion of the motor/generator by alternating the direction of flow of energy between the battery and the motor/generator, wherein the modulation of the magnetic field-forming portion of the motor/generator takes place when the motor/generator is in a no-load state;

a measurement unit for determining a change in voltage at the battery cell and a change in the current flow through the battery cell during the modulation of the magnetic field-forming portion of the motor/generator; and a computing unit for calculating the internal resistance of the battery cell as a quotient of the determined change in voltage and the determined change in the current flow.

6. The device as recited in claim 5, further comprising:
a table which stores a functional dependence of the internal resistance on (i) a cell temperature existing during the determination of the internal resistance and (ii) a charge state of the battery cell existing during the determination of the internal resistance; and an evaluation unit which determines an aging-related increase of the internal resistance of the battery cell on the basis of the determined internal resistance and the functional dependence stored in the table.

7. The device as recited in claim 6, wherein the motor/generator is an induction machine preferably operated via a pulse-controlled inverter.

* * * * *